(12) United States Patent
Zellers et al.

(10) Patent No.: US 9,705,068 B2
(45) Date of Patent: Jul. 11, 2017

(54) ULTRA-THIN INERTIAL ACTUATOR

(71) Applicant: Strategic Polymer Sciences, Inc., State College, PA (US)

(72) Inventors: Brian C. Zellers, Bellefonte, PA (US); Thomas Tremper, State College, PA (US); Raymond Orchard, Jr., State College, PA (US); Christophe Ramstein, San Francisco, CA (US)

(73) Assignee: Novasentis, Inc., State College, PA (US)

( * ) Notice: Subject to any disclaimer, the term of this patent is extended or adjusted under 35 U.S.C. 154(b) by 152 days.

(21) Appl. No.: 13/917,501

(22) Filed: Jun. 13, 2013

(65) Prior Publication Data

US 2013/0335354 A1    Dec. 19, 2013

Related U.S. Application Data

(60) Provisional application No. 61/661,541, filed on Jun. 19, 2012.

(51) Int. Cl.
*G06F 3/01* (2006.01)
*H01L 41/09* (2006.01)
(Continued)

(52) U.S. Cl.
CPC .......... *H01L 41/0926* (2013.01); *G06F 3/016* (2013.01); *H01L 41/083* (2013.01); *H01L 41/193* (2013.01); *G06F 2203/04103* (2013.01)

(58) Field of Classification Search
CPC .......... G06F 3/016; G06F 2203/04103; G06F 3/041; G06F 3/0414; H01L 41/083; H01L 41/0926; H01L 41/193
(Continued)

(56) References Cited

U.S. PATENT DOCUMENTS 5,263,876 A    11/1993  Johnescu et al.
5,350,966 A     9/1994  Culp
(Continued)

FOREIGN PATENT DOCUMENTS

JP    2006048302 A    2/2006
JP    2010283926 A   12/2010
(Continued)

OTHER PUBLICATIONS

Rozic et al., Electrocaloric effect in the relaxor ferroelectric polymer composition P(VDF-TFFE-CFE)0.9-P(VDF-CTFE)0.10, Phase Transitions,vol. 83 Issue 10/11,p. 819-823,Oct. 2010.*
(Continued)

*Primary Examiner* — Amare Mengistu
*Assistant Examiner* — Stacy Khoo
(74) *Attorney, Agent, or Firm* — Hogan Lovells US LLP

(57) ABSTRACT

An inertial actuator includes an electro-active polymer EAP actuator, a substrate, and one or more mass elements. The EAP actuator includes at least one EAP layer located between a pair of driving electrodes. The EAP actuator may include a multilayer stack of alternating EAP layers and electrode layers. The EAP actuator is attached to the substrate (e.g., a flexible polymer substrate), which may be held under tension by attachment points at the periphery of the substrate, at the ends of a beam-type substrate, or the edges of a membrane-type actuator. The EMP actuator induces vibrations in the substrate. One or more mass elements (e.g., metal films) may also be supported by the substrate to enhance the resonator response.

21 Claims, 4 Drawing Sheets

(51) Int. Cl.
   *H01L 41/193* (2006.01)
   *H01L 41/083* (2006.01)
(58) Field of Classification Search
   USPC ........ 345/156, 169, 173–178; 310/329, 330; 359/824
   See application file for complete search history.

(56) References Cited

U.S. PATENT DOCUMENTS

| | | | |
|---|---|---|---|
| 5,519,278 | A | 5/1996 | Kahn et al. |
| 6,294,859 | B1 | 9/2001 | Jaenker |
| 6,376,971 | B1 | 4/2002 | Pelrine et al. |
| 6,423,412 | B1 | 7/2002 | Zhang et al. |
| 6,545,384 | B1 | 4/2003 | Pelrine et al. |
| 6,605,246 | B2 | 8/2003 | Zhang et al. |
| 6,703,257 | B2 | 3/2004 | Takeuchi et al. |
| 6,787,238 | B2 | 9/2004 | Zhang et al. |
| 6,809,462 | B2 | 10/2004 | Pelrine et al. |
| 6,877,325 | B1 | 4/2005 | Lawless |
| 6,888,291 | B2 | 5/2005 | Arbogast et al. |
| 7,034,432 | B1 | 4/2006 | Pelrine et al. |
| 7,038,357 | B2 | 5/2006 | Goldenberg et al. |
| 7,339,572 | B2 | 3/2008 | Schena |
| 7,368,862 | B2 | 5/2008 | Pelrine et al. |
| 7,567,681 | B2 | 7/2009 | Pelrine et al. |
| 7,608,976 | B1* | 10/2009 | Cheng et al. .................. 310/311 |
| 7,944,735 | B2 | 5/2011 | Bertin et al. |
| 7,952,261 | B2 | 5/2011 | Lipton et al. |
| 7,971,850 | B2 | 7/2011 | Heim et al. |
| 8,222,799 | B2 | 7/2012 | Polyakov et al. |
| 8,362,882 | B2 | 1/2013 | Heubel et al. |
| 8,384,271 | B2 | 2/2013 | Kwon |
| 8,390,594 | B2 | 3/2013 | Modarres et al. |
| 8,564,181 | B2 | 10/2013 | Choi |
| 2002/0153807 | A1* | 10/2002 | Schwartz .............. H01L 41/053 310/328 |
| 2003/0059526 | A1* | 3/2003 | Benson .................. C03C 25/22 427/121 |
| 2004/0232807 | A1 | 11/2004 | Pelrine et al. |
| 2007/0200457 | A1* | 8/2007 | Heim .................. H01L 41/0986 310/324 |
| 2007/0200467 | A1 | 8/2007 | Heydt et al. |
| 2008/0284277 | A1 | 11/2008 | Kwon et al. |
| 2008/0303782 | A1* | 12/2008 | Grant et al. .................. 345/156 |
| 2009/0002205 | A1 | 1/2009 | Klinghult et al. |
| 2009/0002328 | A1 | 1/2009 | Ullrich et al. |
| 2009/0115734 | A1* | 5/2009 | Fredriksson et al. ......... 345/173 |
| 2010/0079264 | A1 | 4/2010 | Hoellwarth |
| 2010/0090813 | A1 | 4/2010 | Je et al. |
| 2010/0090814 | A1* | 4/2010 | Cybart et al. .............. 340/407.2 |
| 2010/0316242 | A1 | 12/2010 | Cohen et al. |
| 2011/0038625 | A1* | 2/2011 | Zellers et al. ................. 396/133 |
| 2011/0128239 | A1* | 6/2011 | Polyakov et al. ............ 345/173 |
| 2011/0133598 | A1 | 6/2011 | Jenninger et al. |
| 2011/0290686 | A1 | 12/2011 | Huang |
| 2012/0017703 | A1 | 1/2012 | Ikebe et al. |
| 2012/0105333 | A1 | 5/2012 | Maschmeyer et al. |
| 2012/0121944 | A1 | 5/2012 | Yamamoto et al. |
| 2012/0126663 | A1 | 5/2012 | Jenninger et al. |
| 2012/0126959 | A1 | 5/2012 | Zarrabi et al. |
| 2012/0128960 | A1 | 5/2012 | Busgen et al. |
| 2012/0178880 | A1 | 7/2012 | Zhang et al. |
| 2012/0194448 | A1 | 8/2012 | Rothkopf |
| 2012/0206248 | A1 | 8/2012 | Biggs |
| 2012/0223880 | A1 | 9/2012 | Birnbaum et al. |
| 2013/0099907 | A1* | 4/2013 | Ching et al. .............. 340/407.1 |
| 2013/0100046 | A1* | 4/2013 | Chuang et al. .............. 345/173 |
| 2013/0207793 | A1 | 8/2013 | Weaber et al. |
| 2014/0035735 | A1 | 2/2014 | Zellers et al. |
| 2014/0085065 | A1 | 3/2014 | Biggs et al. |
| 2014/0090424 | A1 | 4/2014 | Charbonneau et al. |
| 2014/0139328 | A1 | 5/2014 | Zellers et al. |
| 2014/0139329 | A1 | 5/2014 | Ramstein et al. |
| 2014/0139436 | A1 | 5/2014 | Ramstein et al. |
| 2014/0140551 | A1 | 5/2014 | Ramstein |
| 2014/0191973 | A1 | 7/2014 | Zellers et al. |
| 2015/0015116 | A1 | 1/2015 | Jiang |

FOREIGN PATENT DOCUMENTS

| | | |
|---|---|---|
| JP | 2011172339 A | 9/2011 |
| JP | 2012134998 A | 7/2012 |
| KR | 20060107259 A | 10/2006 |
| KR | 20100053536 A | 5/2010 |
| KR | 20110110212 A | 10/2011 |
| KR | 20120013273 A | 2/2012 |
| KR | 20120063318 A | 6/2012 |
| KR | 20120078529 A | 7/2012 |
| KR | 20120105785 A | 9/2012 |
| WO | 2010/085575 A1 | 7/2010 |
| WO | WO2011/097020 A2 * | 8/2011 |

OTHER PUBLICATIONS

Matysek, Marc et al., "Combined Driving and Sensing Circuitry for Dielectric Elastomer Actuators in mobile applications", Electroactive Polymer Actuators and Devices (EAPAD) 2011, Proc. of SPIE vol. 7976, 797612, 11 pages.

Neese, Bret et al., "Large Electrocaloric Effect in Ferroelectric Polymers Near Room Temperature", Science vol. 321, Aug. 8, 2008, pp. 821-823.

Zhang Q. M. et al., "Giant Electrostriction and Relaxor Ferroelectric Behavior in Electron-Irradiated Poly(vinylidene fluoride-trifluoroethylene) Copolymer", Science vol. 280, Jun. 26, 1998, pp. 2101-2104.

Xia F. et al., "High Electromechanical Responses in a Poly(vinylidene fluoride-trifluoroethylene-chlorofluoroethylene) Terpolymer", Advanced Materials, vol. 14, Issue 21, Nov. 2002, pp. 1574-1577.

PCT International Search Report and Written Opinion date of mailing Dec. 23, 2013, International Patent Application No. PCT/US2013/053594, 9 pages.

PCT International Search Report and Written Opinion date of mailing Mar. 17, 2014, International Patent Application No. PCT/US2013/071085, 10 pages.

PCT International Search Report and Written Opinion date of mailing Mar. 13, 2014, International Patent Application No. PCT/US2013/071072, 15 pages.

PCT International Search Report and Written Opinion mailing date Mar. 20, 2014, International Patent Application No. PCT/US2013/071075, 12 pages.

PCT International Search Report and Written Opinion date of mailing Mar. 28, 2014, International Patent Application No. PCT/US2013/071078, 13 pages.

PCT International Search Report and Written Opinion date of mailing Apr. 28, 2014, International Patent Application No. PCT/US2013/071062, 11 pages.

PCT International Preliminary Report on Patentability dated May 26, 2015, International Patent Application No. PCT/US2013/071072, 9 pages.

PCT International Preliminary Report on Patentability dated May 26, 2015, International Patent Application No. PCT/US2013/071075, 9 pages.

PCT International Preliminary Report on Patentability dated May 26, 2015, International Patent Application No, PCT/US2013/071078, 10 pages.

PCT International Preliminary Report on Patentability dated May 26, 2015, International Patent Application No. PCT/US2013/071085, 7 pages.

PCT International Preliminary Report on Patentability dated Jul. 7, 2015, International Patent Application No. PCT/IB2013/003212, 15 pages.

PCT International Search Report and Written Opinion date of mailing Oct. 15, 2014, International Patent Application No. PCT/IB2013/003212, 20 pages.

(56) References Cited

OTHER PUBLICATIONS

PCT International Search Report and Written Opinion date of mailing Oct. 22, 2014, International Patent Application No. PCT/US2014/043636, 12 pages.
PCT International Preliminary Report on Patentability for Application No. PCT/US2014/043636, date of mailing Jan. 21, 2016, 6 pages.

* cited by examiner

ULTRA-THIN INERTIAL ACTUATOR

CROSS REFERENCE TO RELATED APPLICATIONS

The present application is related to and claims priority of U.S. provisional patent application (Provisional Application), entitled "Ultra-thin Inertial Actuator," Ser. No. 61/661,541, filed on Jun. 19, 2012. The disclosure of Copending Provisional Application is hereby incorporated by reference in its entirety.

BACKGROUND OF THE INVENTION

1. Field of the Invention

The patent invention is related to electro-active polymer (EAP) or electromechanical polymer (EMP) actuators. In particular, the present invention is related to EAP or EMP actuators that provide a haptic response to a user, such as that of a handheld or mobile device.

2. Discussion of the Related Art

Actuators that are light and miniaturized are highly desirable in many mobile applications. Such actuators may include, for example, eccentric rotating mass (ERM) or linear resonant actuator (LRA) coin motors. However, these actuators consume significant power and are limited in their applications because of their size. Resonance tuning of such actuators are also relatively difficult to provide.

SUMMARY

According to one embodiment of the present invention, an inertial actuator includes an electroactive polymer (EAP) actuator or electromechanical polymer (EMP) actuator, a substrate, and one or more mass elements. (Unless specifically set forth, the current description discusses haptic responses that are electromechanical responses. In that context, the terms "EAP actuator" and "EMP actuator" are used interchangeably.) The inertial actuator may include in the EAP actuator at least one EAP layer located between a pair of driving electrodes. In some embodiments, the EAP actuator may include a multilayer stack of alternating EAP layers and electrode layers. The EAP actuator is attached to the substrate (e.g., a flexible polymer substrate), which may be held under tension by attachment points at the periphery of the substrate, at the ends of a beam-type substrate, or the edges of a membrane-type actuator.

According to one embodiment of the present invention, the EMP actuator induces vibrations in the substrate. One or more mass elements (e.g., metal films) may also be supported by the substrate to enhance the resonator response. Each mass element may be, for example, a metal strip. The mass elements may be attached to one or both sides of the substrate. The metal strip may be an elongated metal film (e.g., a metal foil). In some examples, the mass element may be square, round, or any other suitable geometrical shape. The substrate may be supported, for example, at one or both ends of an elongated strip, or around the periphery of a membrane, by a housing, or by protrusions from a device on which the substrate is supported. The housing may be provided, in part or in whole, by a portable electronic device, for example. The substrate may be a thin membrane supported at some or all of its edges, or portions of edges (e.g., at each end of an elongated strip, two edges of a square or rectangle, or around a square, circular, or other form).

According to one embodiment of the present invention, the actuator provides a haptic response in an electronic device. A discernible haptic response may be provided to a user at a vibration frequency between 100 Hz and 300 Hz. Other vibration frequencies are also possible. According to some embodiments of the present invention, inertial actuators may be provided on flat panel displays, including flexible displays, to achieve devices capable of both visually discernible and touch-responsive haptic functions. The inertial actuator may be formed out of transparent or translucent materials, thereby allowing a user to see an underlying display through the inertial actuator. Some devices, for example, use transparent electrodes (e.g., indium tin oxide (ITO) electrodes), other transparent inorganics, flexible carbon nanotube transparent (CNT) electrodes, conducting polymers, or organic conductors. Such transparent inertial actuators may be included in flat panel and flexible displays.

Inertial actuators of the present invention may be used wherever conventional actuators are used. Some examples of the present invention include a multilayer EAP actuator attached to a substrate, which vibrates with the EAP actuator's electromechanical response when an electrical stimulus is applied to the EAP actuator. An example design includes a clamped thin substrate in the form of a beam (e.g. an elongated flexible strip). The beam may be placed under axial load to increase tension. The axial tension can vary from zero to a value that does not exceed the elastic modulus of the substrate material. This axial tension controls both the magnitude of the acceleration and the resonant frequency, thereby allowing the design to accommodate any haptic frequency and magnitude desired.

Alternatively, the substrate may also have a membrane formed with mechanical boundary conditions on four sides. As in the beam configuration, the membrane may also be under an in-plane tension. In one exemplary design, the membrane to which the EAP actuator is bonded—not the EAP actuator itself—is held in tension. Such an arrangement provides greater reliability in the EAP actuator, as it is not under constant tension. In addition, as the membrane can withstand greater tensile loads, the magnitude of the acceleration in the resulting inertial shaker can be higher. Such designs may also be thinner than prior art designs.

The inertial actuators of the present invention may be driven by a unipolar, single-ended waveform with a peak-to-peak voltage of 150 volts. The inertial actuators may use any inertial mass suitable for achieving the acceleration magnitudes desired. One inertial actuator, which functions as a high definition (HD) inertial haptic actuator, is thin (e.g., less than 5 mm thick, even less than 3 mm in thickness). A thin design allows use in handheld user electronic devices, such as cellular telephones, tablets or portable computers and readers. In addition, inertial actuators of the present invention have much greater fracture resistance to conventional drop tests than ceramic piezoelectric haptic devices.

Unlike conventional electric motor-based haptic devices, the improved inertial actuator designs of the present invention allow frequency and force to be decoupled over the desired haptic frequency response range. This decoupling greatly facilitates a HD haptic response.

Inertial actuators of the present invention allow HD haptic effects to be played directly on the front of a flexible display, and furthermore they are able to provide HD haptic effects while being mechanically deflected by the display to which the inertial actuators are bonded. The transparency of the electrodes allows a user to see the display through the actuators, thus providing a great advantage over devices based on other technologies.

The present invention is better understood upon consideration of the detailed description below in conjunction with the accompanying drawings.

DETAILED DESCRIPTION OF THE PREFERRED EMBODIMENTS

The present invention provides an inertial actuator that is based on an electromechanical polymer (EMP) or electro-active polymer (EAP) multilayer actuator. The suitable included EAP actuator or EMP actuator has one or more EMP or EAP layers, and associated driving electrodes. A driving signal is applied using the driving electrodes to induce an electro-active response. Unless specifically set forth, this detailed description discusses electromechanical haptic responses. In that context, the terms "EAP actuator" and "EMP actuator" are used interchangeably. The EAP actuator may be attached to a substrate, which is free to vibrate in some mode, and may be supported at one or more points around the periphery of the substrate. Further, the substrate may be supported under tension, which allows achieving desired resonance properties. One or more mass elements may also be supported by the substrate, so as to enhance the vibrational response and to yield inertial actuator performance.

In some embodiments, the multilayer EAP actuator may be attached to a small mass (e.g. less than 5 grams). When energized, the EAP actuator vibrates to create the desired HD haptic effect. The inertial actuator may be mechanically grounded to an electronic device, and may transmit the vibration to the device through the mechanical ground. Naturally the vibration may be transferred to the user holding the electronic device. An apparatus that includes inertial actuators of the present invention may be made very thin, with a modest footprint (i.e. surface area). With an attached mass, such an inertial actuator may are suitable for use in providing High Definition (HD) haptic feedback. In this detailed description, the term "HD haptic feedback" refers to a haptic feedback that is less than 1 millisecond latency and which provides over 1G of acceleration within a frequency range between 100 Hz and 300 Hz. Inertial actuators of the present invention may be used for any haptic devices, including those that do not meet the HD specifications. Suitable applications for inertial actuators of the present invention include handheld electronic devices (e.g., cellular phones and tablet computers). HD inertial actuators of the present invention may be made to as thin as less than 3 mm. As these inertial actuators are Polymer-based, they may be made flexible, allowing bending and deflecting mechanically while providing HD haptic feedback.

Figure 1:
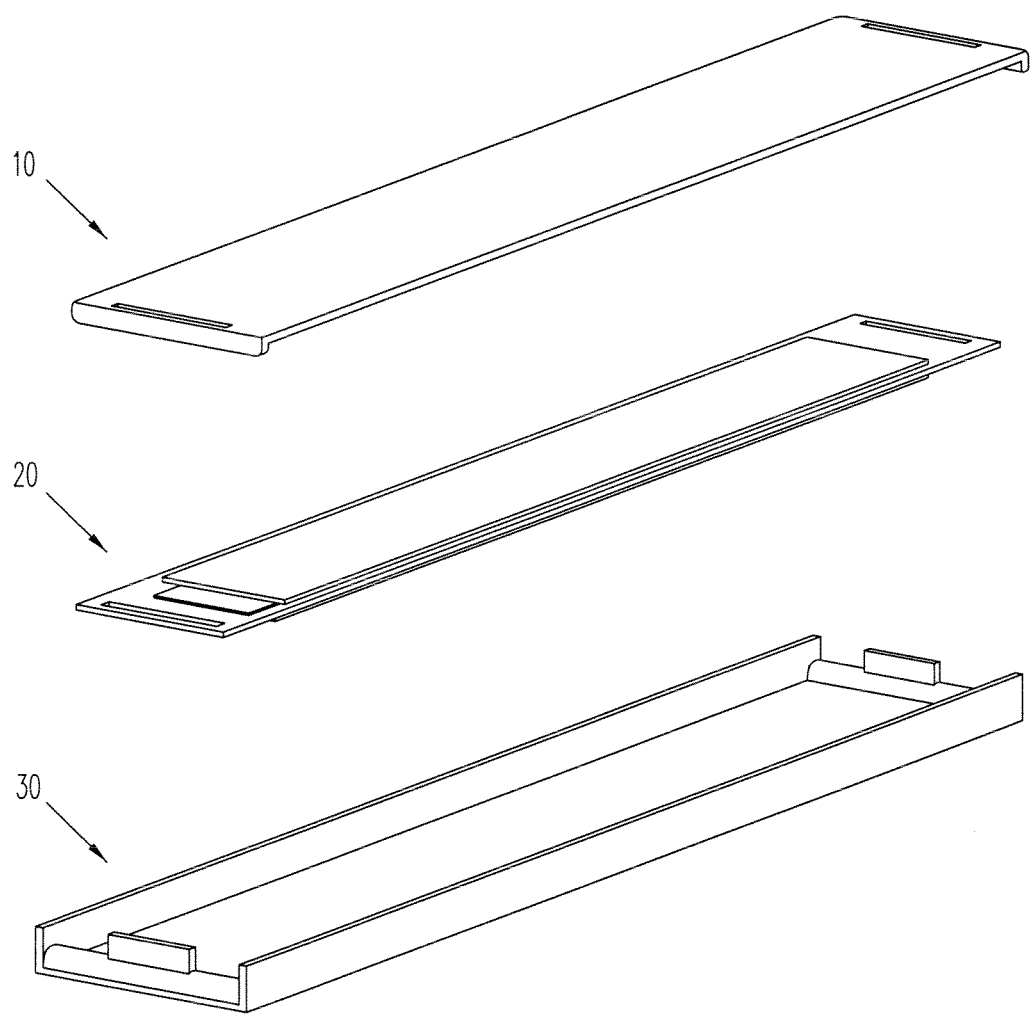
FIG. 1 shows an inertial shaker assembly including inertial actuator 20 contained in housing 30, according to one embodiment of the present invention.

FIG. 1 shows an inertial shaker assembly including inertial actuator 20 contained in housing 30, according to one embodiment of the present invention. In FIG. 1, components of housing 30 are shown "exploded." Lid 10 encloses inertial actuator 20 in housing 30.

Figure 2:
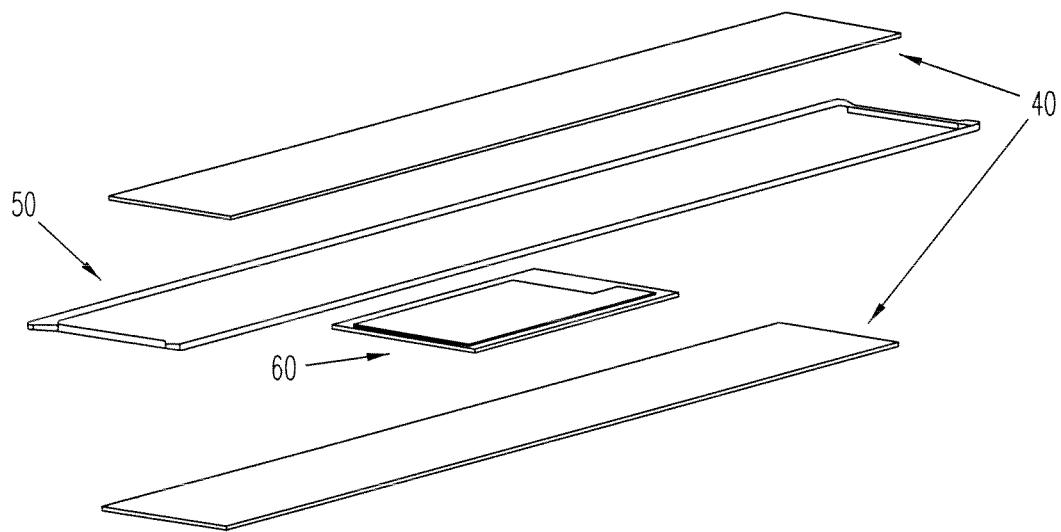
FIG. 2 is an enlarged, exploded view of one implementation of inertial actuator 20 of FIG. 1.

FIG. 2 is an enlarged, exploded view of one implementation of inertial actuator 20 of FIG. 1, which includes electro-active polymer (EAP) actuator 60 that is attached to substrate 50 between two mass elements 40. Substrate 50 supports mass elements 40, which may be provided by tungsten weights. (Although two mass elements are shown, a single mass element may be suitable for some applications). Substrate 50 may be supported by housing 30. In some embodiments, substrate 50 may be provided by a flexible film (e.g., a polymer film, a metal foil, or another suitable thin flexible film) having a thickness between 10 microns and 1 millimeter, though these dimensions are provided herein merely by way of example and are not intended to be limiting.

In some embodiments, a polymer sheet may be subdivided into multiple substrates that are supported by mechanical attachment at intervals, thus defining strips or other desired shapes. Each substrate may then support an inertial actuator. In other examples, substrate 50 may be attached at only one edge, or at one or more points around its periphery. In some examples, a component of an electronic device (e.g., a flexible display element or a keyboard component) may perform both the functions of substrate 50 and mass elements 40. Substrate 50 of inertial actuator 20 may be provided tension by housing 30 and a flexural element. Housing 30 may store elastic potential energy from deformation. In one application, substrate 50 is held under tension by a substrate support, and an electric field is applied to EAP actuator 60 modifies the tension, thus releasing or storing elastic energy in housing 30.

Mass elements 40 may be provided by metal films having, for example, a peripheral shape similar to that of substrate 50. Conforming mass elements 40 to the shape of substrate 50 is not necessary, however. In some cases, substrate 50 may itself act as a mass element. Mass elements 40 may be omitted, for example, when substrate 50 has sufficient mass itself to provide the desired haptic response. In some embodiments, a component of an electronic device (e.g., a button or a display component) may act as a mass element. Mass elements 40 may include metal, or other suitable materials (e.g., polymers or dielectrics). For example, mass elements 40 may each have a mass between 0.5 g-10 g, such as 1 g-5 g.

EAP actuator 60 may be bonded to substrate 50 together and mass elements 40. In some embodiments, a mass element (e.g., tungsten weight) may be bonded to the membrane side of substrate 50 opposite EAP actuator 60. A second mass element may be bonded to the side of substrate 50 where EAP actuator 60 bonds. The bond can be created by any suitable adhesive (e.g., glue) that is strong enough to withstand the forces created by the inertial load on bonded mass elements 40.

When EAP actuator 60 is excited, EAP actuator 60 extends due to the intrinsic electromechanical properties of the electro-active polymer included therein. Since EAP actuator 60 is bonded to substrate 50 on one of its sides, a bending moment due to the extension of EAP actuator 60 bends substrate 50. This bending moment excites substrate 50, creating a mechanical vibration in substrate 50 that is greater near the resonance frequency. An inertial mass (e.g., mass elements 40) serves to tune the resonances, and to provide an increased reaction force in the structure to which the inertial actuator is coupled (e.g., a cellular phone or tablet computers). A tensile pre-stress may be applied to substrate 50 to bias the resonance to a desired value and to create a large restoring force during vibration.

Figure 3:
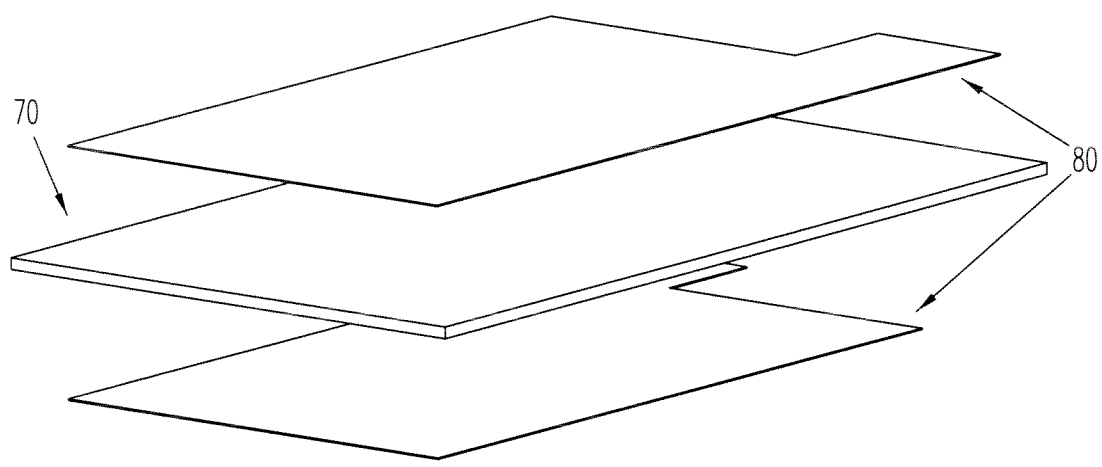
FIG. 3 shows one implementation of EAP actuator 60 of FIG. 2 using a single thin film layer 70 of electromechanical or electro-active polymer having electrodes 80 formed on opposite sides.

FIG. 3 shows one implementation of EAP actuator 60 using a single thin film layer of electromechanical or electro-active polymer having electrodes formed on opposite sides. More generally, EAP actuators of the the present invention include multiple layers of the EAP layers, which may be preferable due to the enhanced electro-active response in a multi-layer actuator. In one embodiment, the electromechanical response to an electrical stimulation of an EAP element induces a vibration in an edge-supported substrate, thus providing a haptic response. The electrical driving signal may be an alternating current signal having any desired waveform, such as a square, a triangle, a sine function, or a pulsed waveform.

Figure 4:
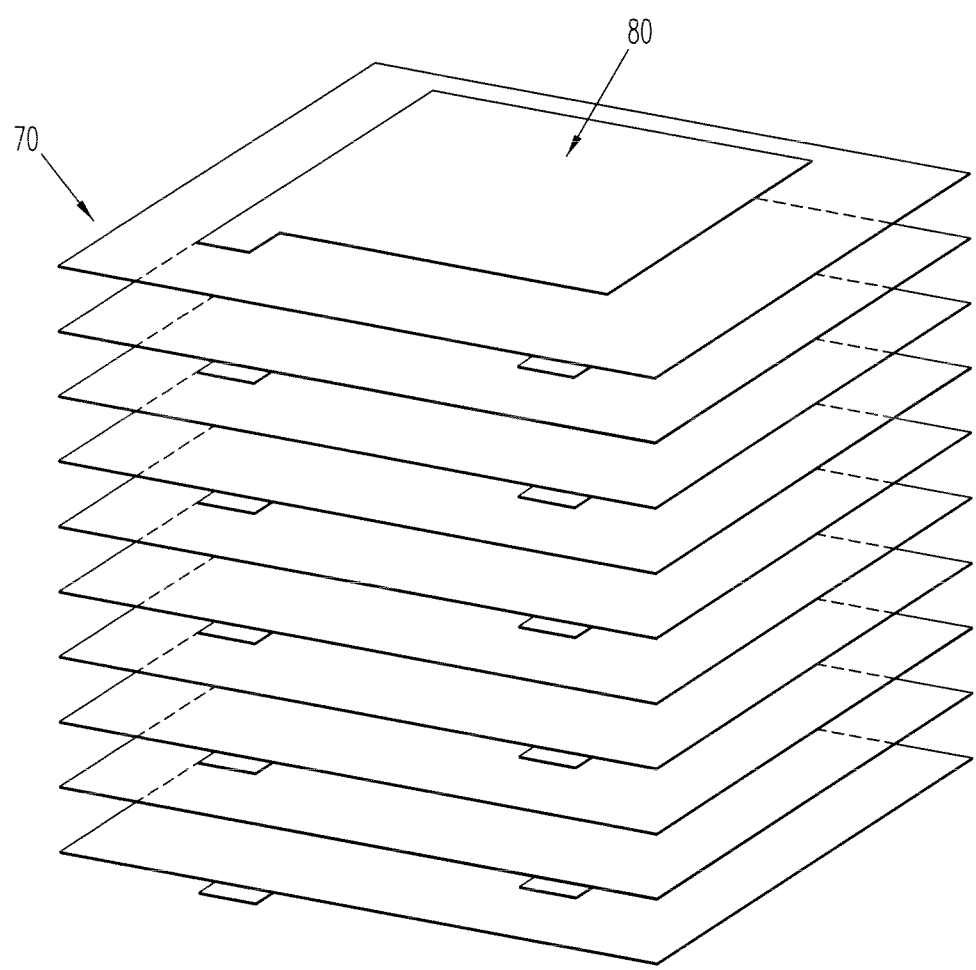
FIG. 4 shows a second implementation of EAP actuator 60 of FIG. 2, including a multilayer EAP actuator 70 formed by alternate layers of electrodes and EAP layers.

FIG. 4 shows a second implementation of EAP actuator 60, including a multilayer EAP actuator formed by alternating layers of electrodes and EAP layers that are laminated together to create a multilayer EAP actuator. Each EAP layer (e.g., EAP layer 70) has two adjacent electrodes (e.g., electrode 80) to provide a potential difference or applied AC signal phases across these adjacent electrodes. Electrode 80 may be constructed from any suitable metal, such as that deposited by sputter, evaporating, or other compatible deposition process. Electrode 80 may also be provided by transparent electrode materials (e.g., ITO or CNT), which are effectively transparent to allow a viewer to perceive a display through the inertial actuator. The sum of the stored spring energy of the frame or substrate and the inertial loads do not yield the EAP actuator when it is working in an antagonistic manner with the compliant frame. EAP actuators with multiple EAP sheets in parallel can offer low driving voltage and high vibrational force.

In some embodiments, substrate 50 is a flexible strip (e.g., a flexible polymer strip), which may be supported at one or both ends. In other embodiments, substrate 50 may be a thin polymer membrane. Substrate 50 may have a central portion that is free to vibrate in response to energization of the attached EAP actuator 60, constrained by mechanical attachment at one or more edges. Applications relevant to inertial actuators of the present invention include providing haptic signal to a human user in the form of, for example, a touch-perceptible vibration. Such an inertial actuator may be integrated with a portable electronic device (e.g., cellular telephones, personal digital assistants (PDAs), smart telephones, tablet computers, and other portable electronic devices, including computers, communications devices, and combinations thereof). In some embodiment, an apparatus of the present invention may be combined with an electronic display, to provide haptic responses to display-based tactile inputs. The inertial actuator may be located within the host device, and activated based on user input through a touch screen. In some embodiments, devices may be integrated with electronic displays that are based on, for example, LED, OLED, LCD, or any other flat panel or flexible display technology.

Haptic feedback enhances the user experience of the host electronic device, thus providing a commercial advantage over products without haptic feedback. The vibration can be vectorized to provide stimulation in a preferred vector direction corresponding to specific human haptic sensitivities. An inertial actuator of the present invention may also include a sensor for detecting a user input, such as a capacitive sensor or touch-screen sensor. A user input sensor may also be an electrical switch actuated by user input. Upon sensing a touch action by a user, a touch screen can be vibrated out of plane or in plane depending on the design requirements. These designs may consist of bending motions, torsional motions, and linear motions actuating directly onto a user. Other examples of designs use the same bending, torsional, and linear motions to resist user inputs to joysticks, buttons, styluses, steering wheels, or other rigid input implement. Such inertial actuators may be actuated by a voltage less than or equal to 200 volts.

EAP-based inertial actuators may be flexible and not susceptible to fracture when dropped, thus possessing an advantageous characteristic not present in a conventional piezoelectric device. In addition, inertial actuators can decouple frequency of vibration from acceleration magnitude, allowing a tuned haptic feedback ability over a desired frequency range (e.g., a HD haptic response). Such decoupling, which represents a significant advantage, is not present in conventional ERM or LRA coin motors. The driving voltage for driving an EAP actuator within the inertial actuator is typically at or below 150 volts, which can be accommodated by handheld consumer electronic devices without concern for component cost or requiring a PCB layout that provides special high voltage isolation.

Haptic responses are also particularly valuable in a screen interface of a portable electronic device. Such a screen interface includes a screen-based keyboard, or another user data entry mechanism. In some embodiments, substrate 50 may extend over a front face of an electronic display. In one instance, haptic pixels (hixels) may be fabricated on the front of the display. As previously discussed, for example, a polymer sheet may be supported at intervals, the intervals determining a hixel dimension, and an inertial actuator is included in each hixel. The hixels may be appreciably larger than the display pixels. The inertial actuator may be effectively (partially) transparent if a display can be visually perceived by a user behind the inertial actuator. The haptic feedback may include a vibration in the range of 10 Hz-1 kHz, preferably 100 to 300 hertz, clicks, or other touch-perceptible responses. (These frequencies are merely exemplary and are not intended to be limiting.) In some embodiments, the resonance characteristics may be tuned by modifying the substrate configuration or mass elements. In this way, the resonance characteristics are largely independent of the structure of the inertial actuator.

In one embodiment, the EAP layer is stretched in one direction, with a thickness of less than 10 micrometers or microns and an elastic modulus higher than 100 MPa at 25° C., with electromechanical strain higher than 0.5% at 100 MV/m in the stretched direction. Electrodes are configured to apply an electric field across an electroded portion of the EAP layer, so as to induce an electromechanical response in the electroded portion of the EAP layer. The thickness of each EAP layer is preferably less than or approximately equal to 50 microns, such as less than 7 micrometers, for example less than or approximately equal to 5 micrometers, and less than or approximately equal to 3 micrometers. An EAP layer may have an elastic modulus higher than 500 MPa at 25° C. and electromechanical strain higher than 0.5% at 50 MV/m, such as an elastic modulus higher than 300 MPa at 25° C. and an electromechanical strain higher than 0.5% at 50 MV/m.

Inertial actuators of the present invention may be configured to generate an acceleration magnitude response of greater than 1 G at a frequency between 100 Hz and 300 Hz; in some embodiments, an acceleration of greater than 2.5 G at 150 Hz, and in some embodiments an acceleration of greater than 2 G at 200 Hz. A one-to-one correspondence between the drive signal and the acceleration output may be achieved in the time domain, making an inertial actuator of the present invention high-definition capable.

In one embodiment, two or more inertial actuators of the present invention can be linked together mechanically to enhance the acceleration response and force output. Two or more such inertial actuators can be electrically linked together so that the discharged energy from one actuator, whether electric or mechanical, may be applied to the other through an electric circuit or other linkage. The mechanical resonance can occur within the haptic band of 100 Hz to 300 Hz, without compromising the high definition characteristics within that frequency band.

Other applications of the inertial actuators of the present invention include providing acoustic tones, other discernible acoustic signals, or other sounds, either in combination or separately from a haptic response, or in some embodiments act as an ultrasound source. Inertial actuators may also act as improved sensors, when the substrate vibration induces a measurable electrical signal in the inertial actuator.

In the embodiments described above, the inertial actuator operates by longitudinal extension of the EAP element in the plane of the substrate, so as to stretch the substrate in the elongation direction or otherwise within the plane of the substrate. Alternatively, the inertial actuator may also operate by varying the thickness of the EAP layers, thus providing a normal force on the substrate. In other embodiments, the response may result from a combination of longitudinal extension and cross-sectional thickness variations.

Devices of the present invention provide great advantages over conventional haptic devices (e.g., ERM or LRA coin motors). As known to those of ordinary skill in the art, an ERM creates vibration by rotating an unbalanced mass on a motor shaft. Thus, an ERM cannot offer a HD haptic solution as it couples the frequency of vibration and the resulting magnitude of vibration acceleration. For example, in an ERM, a higher desired acceleration results in a higher vibration frequency, so that achieving a high force at a lower frequency is not possible. The LRA uses an electromagnet voice coil to pull a ferromagnetic mass against a wave spring. When the voice coil voltage is released, the mass spring system oscillates according to its natural frequency. This LRA design produces a large acceleration at one frequency, termed the resonant frequency. Acceleration at any off-resonant frequency is much lower in magnitude, and thus is unable to accommodate the magnitude requirements for the HD frequency band of interest. Inertial actuators of the present invention, however, have resonance frequencies that may be adjusted by adjusting the tension of the substrate or mass element weights. Furthermore, conventional LRA piezo-ceramic designs are brittle.

In conventional dielectric elastomers, a high voltage (e.g., in kilovolts) is required to create an appreciable vibration. Such a high voltage is hazardous and typically requires expensive special circuit isolation not readily available to handheld consumer electronic devices. In comparison, much lower voltages, such as voltages below 200V, may be used with an inertial actuator of the present invention.

The EAP or EMP layers of the inertial actuators of the present invention, in film form, may be selected from P(VDF$_x$-TrFE$_y$-CFEI$_{-x-y}$), P(VDF$_x$-TrFE$_y$-CTFE$_{-x-y}$), poly(vinylidene fluoride-trifluoroethylenevinylidede chloride) (P(VDF-TrFE-VC)), poly(vinylidene fluoride-tetrafluoroethylenechlorotrifluoroethylene) (P(VDF-TFE-CTFE)), poly(vinylidene fluoride-trifluoroethylenehexafluoropropylene), poly(vinylidene fluoride-tetrafluoroethylene-hexafluoropropylene), poly(vinylidene fluoride-trifluoroethylene-tetrafluoroethylene), poly(vinylidene fluoridetetrafluoroethylene-tetrafluoroethylene), poly(vinylidene fluoride-trifluoroethylene-vinyl fluoride), poly(vinylidene fluoride-tetrafluoroethylene-vinyl fluoride), poly(vinylidene fluoridetrifluoroethylene-perfluoro(methyl vinyl ether)), poly(vinylidene fluoride-tetrafluoroethylene-perfluoro (methyl vinyl ether)),poly(vinylidene fluoride-trifluoroethylene-bromotrifluoroethylene, polyvinylidene), poly(vinylidene fluoride-tetrafluoroethylenechlorofluoroethylene), poly(vinylidene fluoride-trifluoroethylene-vinylidene chloride), and poly(vinylidene fluoride-tetrafluoroethylene vinylidene chloride), or in a general form of P(VDF$_x$-2nd monomer$_y$-3rd monomer$_{1-x-y}$), where x may range from 0.5 to 0.75, and y may range from 0.45 to 0.2. Suitable polymers are also described in U.S. Pat. No. 6,787,238.

A suitable EAP can also be selected from high energy electron irradiated P(VDF$_x$-TrFE$_{1-x}$) copolymers, where x varies from 0.5 to 0.75 (See U.S. Pat. Nos. 6,423,412 and 6,605,246 for representative examples). A suitable EAP can be selected from the copolymer of P(VDF$_{1-x}$-CTFE$_x$) or P(VDF$_{1-x}$-HFP$_x$) where x ranges from 0.03 to 0.15 in moles. A suitable EAP can be a blend of one or more terpolymers with one or more other polymers. The EAP film can be uniaxially stretched and in fabricating the EAP actuator, the uniaxial stretching direction may be along the displacement direction of the actuator. The EAP films can be in a non-stretched form or biaxially stretched.

The EAP of the present invention may include semi-crystalline electromechanical polymer-based actuator materials (e.g., modified P(VDF-TrFE)), which provide remarkably improved performance for high definition haptics in handheld consumer devices. These EAP actuators are shock tolerant, require modest voltages consistent with requirements in OEM products, and are capable of high definition responses. Such an electro-active material can exhibit significant electrostriction (e.g., an electric field-induced strain 7%, a 70 times increase over the conventional piezo-ceramics and piezo-polymers). Furthermore, this class of polymers also possesses a high force capability, as measured by the high elastic energy density of 1 J/cm3. Suitable EAPs in this class include high energy density irradiated poly(vinylidene fluoridetrifluoroethylene) (P(VDF-TrFE), as described in U.S. Pat. Nos. 6,423,412 and 6,605,246), P(VDFTrFE)-based terpolymers, such as poly(VDF-TrFE-chlorotrifluoroethylene), (P(VDF-TrFECTFE)), poly(vinylidene fluoride-trifluoroethylenechlorofluoroethylene), (P(VDF-TrFE-CFE)), and the like. U.S. Pat. No. 6,787,238). The disclosures in patent applications referred to in this application are incorporated herein by reference. The EAP layer may also be a relaxor ferroelectric polymer. A relaxor ferroelectric polymer may be a polymer, copolymer, or terpolymer of vinylidene fluoride. Examples include P(VDF-TrFE-CFE) or P(VDF-TrFE-CTFE) terpolymer, a high energy irradiated P(VDF$_x$-TrFE1-x) copolymer, where x is between 0.5 and 0.75 inclusive, P(VDF1-x-CTFEx) or P(VDF1-x-HFPx) where x is in the range from 0.03 to 0.15 molar, polymer blends such as blends of P(VDF-CTFE) with P(VDF-TrFE-CFE) or P(VDF-TrFE-CTFE), where the content of P(VDF-CTFE) is between 1% and 10% by weight.

The detailed description above is provided to illustrate specific embodiments of the present invention and is not intended to limiting. Numerous modifications and variations within the scope of the present invention are possible. The present invention is set forth in the accompanying claims.

We claim:

1. An apparatus, comprising:
an electromechanical polymer actuator, including an electromechanical polymer layer and electrodes configured to induce an electromechanical response in the electromechanical polymer actuator;
a substrate supporting the electromechanical polymer actuator;
a mass element supported by the substrate; and
a support structure supporting the substrate, wherein the support structure is not integrated with the electromechanical polymer actuator, and wherein the support structure stores an elastic potential energy from deformation and provides tension to the substrate so that the electromechanical response in the electromechanical polymer actuator modifies the tension and induces a vibrational response in the substrate and the mass element, wherein the substrate comprises a flexible film supported at intervals by the support structure, and wherein the vibrational response has a frequency between 100 Hz to 300 Hz.

2. The apparatus of claim 1, wherein the apparatus comprises a high-definition haptic device or an electronic device having a haptic response.

3. The apparatus of claim 1, wherein the substrate comprises a flexible polymer strip or membrane.

4. The apparatus of claim 1, wherein the mass element comprises a metal.

5. The apparatus of claim 1, wherein the electromechanical polymer layer includes a relaxor ferroelectric polymer.

6. The apparatus of claim 5, wherein the relaxor ferroelectric polymer comprises a polymer, copolymer, or terpolymer of vinylidene fluoride.

7. The apparatus of claim 1, the electromechanical polymer layer including a polymer selected from a group of polymers consisting of:
$P(VDF_x\text{-}TrFE_y\text{-}CFE_{1-x-y})$ (CFE: chlorolluoroethylene), $P(VDF_x TrFE_y\text{-}CTFE_{1-x-y})$ (CTFE: chlorotritluoroethylene), Poly(vinylidene tluoride-trifluoroethylene-vinylidede chloride) (P(VDF-TrFE-VC)), poly(vinylidene fluoride-tetrafluoroethylene-chlorotrilluoroethylene) (P(VDF-TFE-CTFE)), poly(vinylidene fluoride-trifluoroethylene-hexafluoropropylene), poly(vinylidene fluoride-tetrafluoroethylene- hexafluoropropylene), poly(vinylidene fluoridetrifluoroethylene-tetrafluoroethylene), poly(vinylidene fluoride-tetrafluoroethylenetetrafluoroethylene), poly(vinylidene fluoride-tri fluoroethylene-vinyl fluoride), poly(vinylidene fluoride-tetrafluoroethylene-vinyl fluoride), poly(vinylidene fluoride-trifluoroethyleneperfluoro(methyl vinyl ether)), poly(vinylidene fluoride-tetrafluoroethylene-perfluoro (methyl vinyl ether)), poly(vinylidene fluoride-rifluoroethylene-bromotrifluoroethylene, polyvinylidene), poly(vinylidene fluoride-tetrafluoroethylene-chlorofluoroethylene), poly(vinylidene fluoride-trifluoroethylene-vinvlidene chloride), and poly (vinylidene fluoridetetrafluoroethylene vinylidene chloride), where x ranges between 0.5 and 0.75 and y ranges between 0.45 and 0.2.

8. The apparatus of claim 1, the electromechanical polymer layer including being P(VDF-TrFE-CFE) or P(VDF-TrFE-CTFE) terpolymer.

9. The apparatus of claim 1, the electromechanical polymer layer including a high energy irradiated $P(VDF_x\text{-}TrFE_{1-x})$ copolymer, where x is between 0.5 and 0.75 inclusive.

10. The apparatus of claim 1, the electromechanical polymer layer including $P(VDF_{1-x}\text{-}CTFE_x)$ or $P(VDF_{1-x}, \text{-}HFP_x)$ where x is in the range from 0.03 to 0.15 molar.

11. The apparatus of claim 1, the electromechanical polymer layer including a blend of P(VDF-CTFE) with P(VDF-TrFE-CFE) or P(VDF-TrFE-CTFE), where the content of P(VDF-CTFE) is in the range of 1% to 10% by weight.

12. A portable electronic device including the apparatus of claim 1.

13. A haptic feedback device including the apparatus of claim 1.

14. An apparatus, comprising:
a substrate;
a substrate support holding the substrate, the substrate support storing an elastic potential energy from deformation and providing tension to the substrate; and
an electromechanical polymer actuator attached to the substrate, wherein the electromechanical polymer actuator is not integrated with the substrate support, wherein the electromechanical polymer actuator modifies the tension and provides an electromechanical response in response to an electric signal, the electromechanical response inducing a vibration in the substrate, the substrate being supported by the substrate support at peripheral regions so as to facilitate the vibration of the substrate, wherein the substrate comprises a flexible film supported at intervals by the substrate support, and wherein the vibration has a frequency between 100Hz and 300 Hz.

15. The apparatus of claim 14, the electromechanical response inducing an extension of the substrate.

16. The apparatus of claim 14, further including a mass element attached to the substrate, the mass element being vibrated by the electromechanical response of the electromechanical polymer actuator.

17. A portable electronic device including the apparatus of claim 14.

18. A haptic feedback device including the apparatus of claim 14.

19. An apparatus, comprising:
a haptic device, the haptic device having an inertial actuator including:
an electromechanical polymer actuator, including electrodes configured to induce an electromechanical response in the electromechanical polymer actuator;
a substrate, supporting the electromechanical polymer actuator;
a support structure supporting the substrate, wherein the support structure is not integrated with the electromechanical polymer actuator, and wherein the support structure stores an elastic potential energy from deformation and provides tension to the substrate, so that the electromechanical response in the electromechanical polymer actuator modifies the tension and induces a vibrational response in the substrate, wherein the substrate comprises a flexible film supported at intervals by the support structure, and wherein the vibrational response has a frequency between 100Hz and 300 Hz.

20. The apparatus of claim 19, the haptic device providing haptic feedback based on tactile inputs received.

21. The apparatus of claim 19, the inertial actuator further comprising a mass element supported by the substrate.

* * * * *

UNITED STATES PATENT AND TRADEMARK OFFICE
CERTIFICATE OF CORRECTION

PATENT NO. : 9,705,068 B2
APPLICATION NO. : 13/917501
DATED : July 11, 2017
INVENTOR(S) : Brian C. Zellers et al.

It is certified that error appears in the above-identified patent and that said Letters Patent is hereby corrected as shown below:

Column 9, Line 37, "chlorolluoroethylene" should be --chlorofluoroethylene--

Column 9, Line 38, "chlorotritluoroethylene" should be --chlorotrifluoroethylene--

Column 9, Line 41, "chlorotritluoroethylene" should be --chlorotrifluoroethylene--

Column 9, Line 52, "rifluoroethylene" should be --trifluoroethylene--

Column 9, Line 55, "vinvlidene" should be --vinylidene--

Signed and Sealed this
Twenty-second Day of August, 2017

Joseph Matal
*Performing the Functions and Duties of the
Under Secretary of Commerce for Intellectual Property and
Director of the United States Patent and Trademark Office*